(12) United States Patent
Hayakawa

(10) Patent No.: US 6,696,668 B2
(45) Date of Patent: Feb. 24, 2004

(54) LASER SOLDERING METHOD AND APPARATUS

(75) Inventor: Jun Hayakawa, Fukui (JP)

(73) Assignees: Fine Device Co., Ltd., Sakai-gun (JP); Japan Unix Co., Ltd., Tokyo (JP)

( * ) Notice: Subject to any disclaimer, the term of this patent is extended or adjusted under 35 U.S.C. 154(b) by 46 days.

(21) Appl. No.: 09/832,894

(22) Filed: Apr. 12, 2001

(65) Prior Publication Data

US 2001/0054637 A1 Dec. 27, 2001

(30) Foreign Application Priority Data

Jun. 26, 2000 (JP) ........................................ 2000-191109

(51) Int. Cl.$^7$ .......................... B23K 26/02; B23K 26/14
(52) U.S. Cl. ............................ 219/121.85; 219/121.83; 219/121.84
(58) Field of Search ..................... 219/121.63, 121.64, 219/121.75, 121.83, 121.84, 121.85; 228/219, 42, 20.1, 20.5

(56) References Cited

U.S. PATENT DOCUMENTS

| | | | | |
|---|---|---|---|---|
| 3,534,462 A | * | 10/1970 | Cruickshank et al. | 228/180.21 |
| 4,673,795 A | * | 6/1987 | Ortiz, Jr. | 219/121.6 |
| 5,045,668 A | * | 9/1991 | Neiheisel et al. | 219/121.83 |
| 5,045,679 A | * | 9/1991 | Suzuki et al. | 250/201.1 |
| 5,122,635 A | * | 6/1992 | Knodler et al. | 219/121.63 |
| 5,168,141 A | * | 12/1992 | Tashjian et al. | 219/121.63 |

FOREIGN PATENT DOCUMENTS

| | | | | |
|---|---|---|---|---|
| DE | 199 03 881 | * | 8/2000 | ........... B23K/26/02 |
| JP | 58-161396 | | 9/1983 | |
| JP | 60-102604 | * | 6/1985 | ............ G02B/6/42 |
| JP | 60-121095 | * | 6/1985 | ........... B23K/26/02 |
| JP | 63-137576 | | 6/1988 | |
| JP | 2-25271 | * | 1/1990 | ........... B23K/1/005 |
| JP | 6-170522 | * | 6/1994 | ........... B23K/1/005 |
| JP | 8-195554 | | 7/1996 | |
| JP | 8-285785 | | 11/1996 | |
| JP | 2001-156436 | * | 6/2001 | ............ H05K/3/34 |

* cited by examiner

Primary Examiner—M. Alexandra Elve
Assistant Examiner—Kevin P. Kerns
(74) Attorney, Agent, or Firm—Oblon, Spivak, McClelland, Maier & Neustadt, P.C.

(57) ABSTRACT

An image pickup camera is mounted on a soldering head for projecting a laser beam in such a manner that its optical axis coincides with that of the laser beam. An image of the object to be soldered, which is taken by the camera, is displayed on a monitor screen, and a projection spot, which is positioned on an optical axis of the laser beam, is displayed on the screen. While the positional relationship between the object to be soldered and the projection spot is observed on the monitor screen, the soldering head and the object to be soldered are moved relative to each other and the projection spot is positioned. Subsequently, the laser beam is projected from the soldering head, thus, performing soldering.

6 Claims, 4 Drawing Sheets

LASER SOLDERING METHOD AND APPARATUS

TECHNICAL FIELD OF THE INVENTION

The present invention relates to an apparatus for accurately soldering electronic parts, such as ICs, LSIs, and other works, using a laser beam.

DESCRIPTION OF THE RELATED ART

Techniques for soldering using a laser beam are well known, as disclosed in, for example, Japanese Unexamined Patent Application Publication Nos. 58-161396 and 63-137576. According to such techniques, a laser beam is projected onto the object to be soldered, such as a printed board, from a soldering head to melt the solder with heat therefrom. Thus, it has advantages such that soldering can be performed without coming into contact with the object.

In the soldering by the laser beam, first, the object to be soldered must be positioned so that the laser beam can be projected onto the object to be soldered while a proper positional relationship is held therebetween. For example, as shown in FIGS. 4(A) and 4(B), when metallic patterns 3, which are each printed around one of a plurality of connecting holes 2 on a printed board 1, are soldered to connector pins 5 of an electronic part 4, each of the connector pins being inserted in one of the connecting holes 2, positioning is performed so that a laser beam 6 is projected onto both the metallic pattern 3 and the connector pin 5 at a proper ratio, one of which is shown on an enlarged scale in FIG. 5, and a thread-like solder 7 is then supplied, thus, performing soldering.

Conventionally, during positioning, in the case where the laser beam has a visible light area, the laser beam is projected onto the object to be soldered, and the soldering head or the work is moved while the projected part is observed with the naked eye. In addition, in the case where the laser beam has no visible light area, the visible light is formed with a He-Ne laser or the like and is then projected imitatively, thus, the positioning is similarly performed while being observed with the naked eye.

The laser beam is, however, an extremely thin beam of light, the object to be soldered is also an extremely small point, and the operation space for soldering is small; accordingly, it is difficult for an operator to bring his face near the object to be soldered and to look straight at the part, so that the operator can only take a peep at it from a position diagonally above. Therefore, it is very difficult to position the laser beam while observing the object to be soldered with the naked eye, and thus, it is almost impossible to perform accurate and efficient positioning in a short time.

DISCLOSURE OF THE INVENTION

It is therefore a technical object of the present invention to allow positioning of a projection position of a laser beam to be easily and accurately performed in a short time, and to increase the accuracy of the subsequent soldering when the laser beam is projected onto the object to be soldered for soldering.

In order to achieve the above object, according to the present invention, there is provided a laser soldering method, characterized in that an image pickup camera is mounted on a soldering head for projecting a laser beam for soldering toward an object to be soldered in such a manner that an optical axis thereof coincides with that of the laser beam; and the camera images the object to be soldered and displays the image on a monitor screen, wherein a projection spot positioned on the optical axis of the laser beam is displayed on the monitor screen; wherein, while the positional relationship between the object to be soldered and the projection spot is observed on the monitor screen, the soldering head and the object to be soldered are moved relative to each other to position the projection spot; and subsequently, the laser beam is projected from the soldering head to the object to be soldered, thus, performing soldering.

According to the present invention, as described above, the positioning is performed while the positional relationship between the object to be soldered, which is displayed on the screen of the monitor on an enlarged scale, and the projection spot of the laser beam is observed. Thus, the positioning operation can be significantly accurately performed in a short time compared with the conventional method in which positioning is performed while the slight soldering point is observed with the naked eye from a position diagonally above. Consequently, the accuracy of soldering subsequent to that can be improved and the time required for the entire soldering operation can be significantly reduced, thereby improving the operating efficiency.

In the present invention, preferably, soldering is performed while a hot inert gas, which is heated to a specified temperature in advance, is ejected from a gas ejection nozzle provided at the soldering head along an optical axis of the laser beam. Thus, oxidation and rejection of solder can be reliably prevented and the soldering accuracy can be significantly improved.

According to the present invention, in order to embody the above described method, there is provided a laser soldering apparatus characterized by comprising: a soldering head for projecting a laser beam for soldering toward an object to be soldered; a laser mechanism connected to the soldering head; an image pickup camera mounted on the soldering head in such a manner that an optical axis thereof coincides with that of the laser beam; a monitor which displays an image of the object to be soldered, which is captured by the camera, on a screen, and which displays a projection spot of the laser beam on the screen; and a control device for moving the object to be soldered and the soldering head relative to each other.

In this instance, the soldering head may be supported by a movable arm, and the movable arm may be controlled by the control device.

The projection spot displayed on the monitor screen is indicated by a portion surrounded by two vertical parallel lines and two horizontal parallel lines, wherein the size of the projection spot is freely adjusted by changing the interval between the parallel lines.

In the soldering apparatus having the above described structure, since the image pickup camera is mounted on the soldering head in such a manner that the optical axis thereof coincides with that of the laser beam, and the soldering head is used for both projection of the laser beam and imaging by the camera, the structure is simple and streamlined, and the positioning of the projection spot of the laser beam to the object to be soldered can be easily and accurately performed. Also, immediately after completion of positioning, the soldering operation by the laser beam can be started; therefore, after positioning, there is no need to move the camera to another position where it is not used.

In the present invention, the soldering head includes a cylindrical casing having a projection aperture for projecting a laser beam at an end thereof, optical lenses disposed in the casing, and a half mirror disposed at a position nearer to a base end of the casing than to the optical lenses in such a manner that the half mirror is disposed at an angle of 45 degrees to the optical axis of the optical lenses, wherein a camera is mounted on the base end of the casing in such a manner that it can image the object to be soldered from the projection aperture via the half mirror and the optical lenses, and wherein an optical fiber for outputting the laser beam from a laser mechanism toward the half mirror is connected to a fiber connecting section formed at the side of the casing at a position corresponding to the half mirror.

The fiber connecting section may include switching means for switching the diameter of the laser beam which is output from the optical fiber.

Preferably, the soldering head includes a gas ejection nozzle for ejecting an inert gas along the optical axis of the laser beam, and a gas supply mechanism for supplying a hot inert gas, which is heated in advance, is connected to the gas ejection nozzle.

DESCRIPTION OF THE PREFERRED EMBODIMENT

Figure 1:
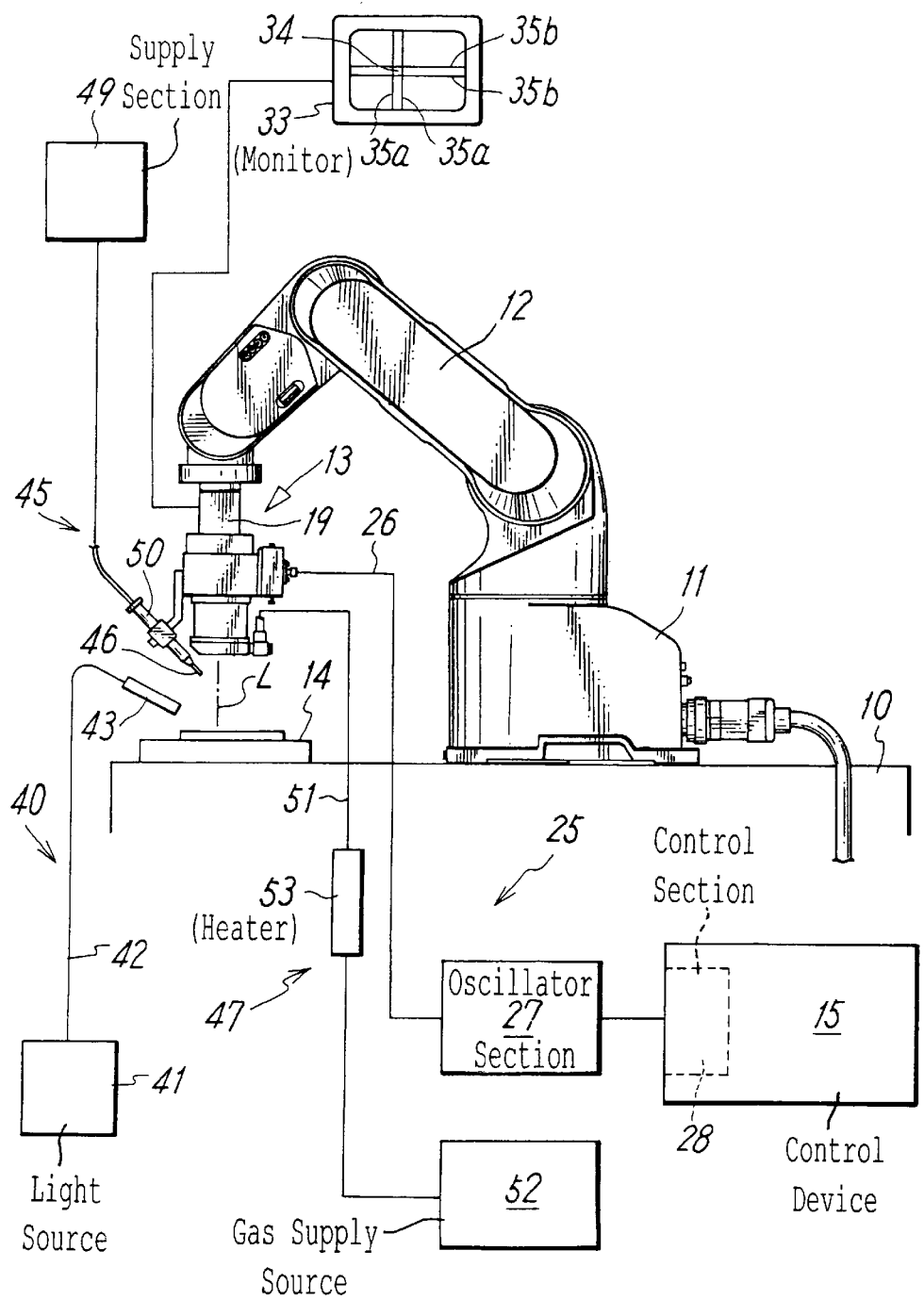
FIG. 1 is a side view showing an embodiment of a soldering apparatus according to the present invention.

FIG. 1 shows a preferred typical embodiment of a soldering apparatus according to the present invention, wherein the soldering apparatus is constructed as a jointed-arm robot having five links (five degrees of freedom). In the drawing, reference numeral 10 denotes a working base; 11 denotes a robot main body mounted on the base 10; 12 denotes a jointed movable arm extending from the robot main body 11 in the forward direction, and having five degrees of freedom, which can be rotated and freely bent and extended; 13 denotes a soldering head mounted at the end of the movable arm 12; 14 denotes an object to be soldered placed on the base 10, such as a printed board 1 shown in FIG. 4; and 15 denotes a control device for controlling the movable arm 12.

Figure 2:
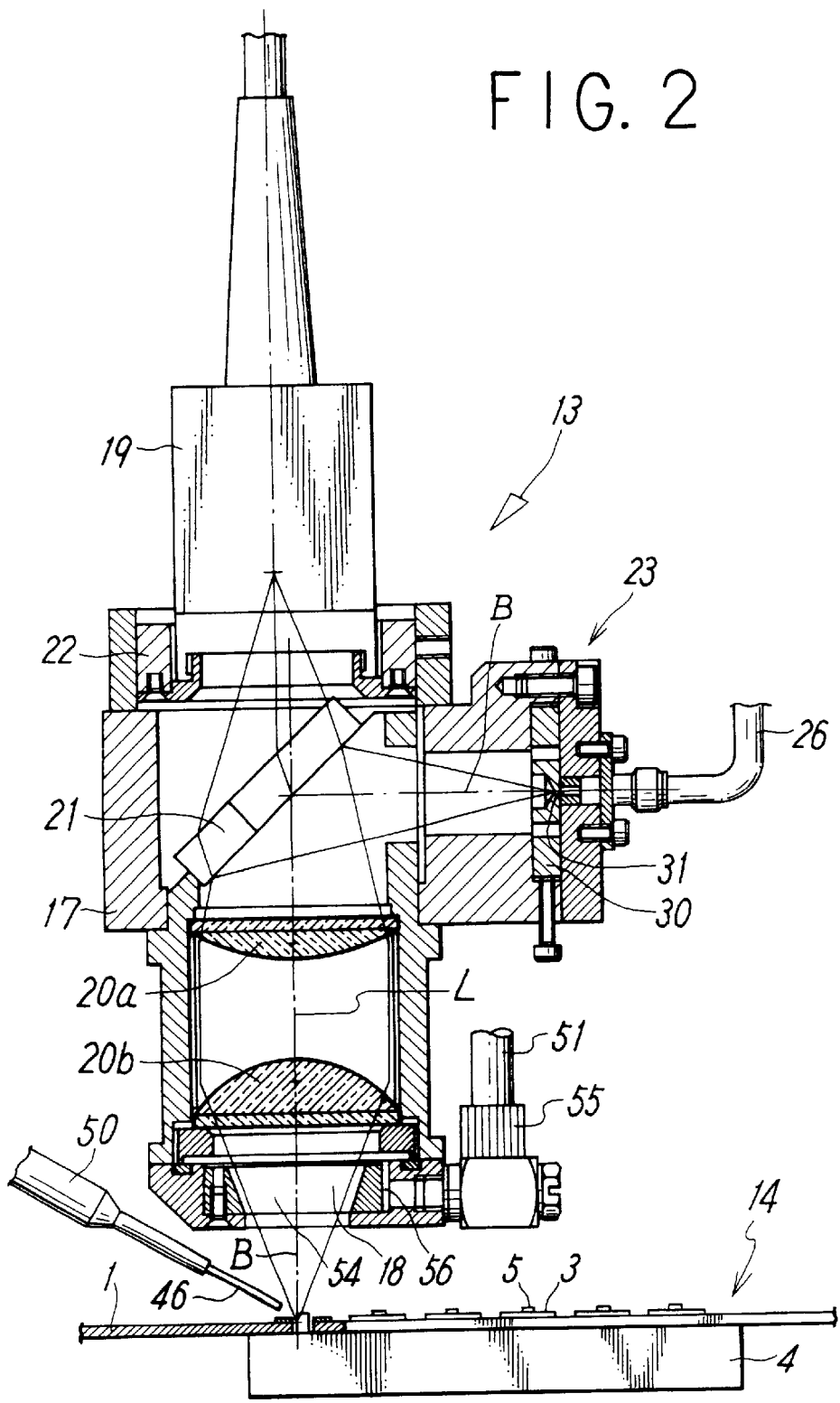
FIG. 2 is an enlarged cross sectional view of a soldering head.

The soldering head 13 includes a casing 17 having a cylindrical shape, as shown in FIG. 2. The casing 17 has a projection aperture 18 for projecting a laser beam B at the end thereof, and has, therein, a pair of optical lenses 20a and 20b provided along an optical axis L of the laser beam B, which are used both for projecting the laser beam B and for imaging for a camera 19, and a half mirror 21 disposed at a position nearer to the base end of the casing than to the optical lenses 20a and 20b at an angle of 45 degrees to the optical axis L.

A camera mounting section 22 is formed on the optical axis L at the base end of the casing 17, and the camera 19 is mounted on the camera mounting section 22 so that an image of the object 14 to be soldered can be captured from the front via the half mirror 21 and the optical lenses 20a and 20b. A CCD camera is most suitable as the camera 19. In addition, a fiber connecting section 23 is formed at the side of the casing 17, at a position corresponding to the half mirror 21, and an end of an optical fiber 26 extending from a laser mechanism 25 is connected to the connecting section 23 so that the laser beam B can be projected to the half mirror 21 at an input angle of 45 degrees. During the soldering operation, the laser beam B, which is output from the optical fiber 26, is reflected at 90 degrees along the optical axis L by the half mirror 21, and is then projected to the object 14 to be soldered through the projection aperture 18 via the optical lenses 20a and 20b. Accordingly, the laser beam B and the camera 19 have a common optical axis L in the optical path from the half mirror 21 to the object 14 to be soldered via the pair of optical lenses 20a and 20b.

The laser mechanism 25 includes an oscillator section 27 for generating the laser beam due to the excitation of a laser diode, a control section 28 for controlling the oscillator section 27, and the optical fiber 26 for transmitting the laser beam B which is output from the oscillator section 27 to the soldering head 13, wherein the control section 28 is enclosed in the control device 15.

In addition, the fiber connecting section 23 in the soldering head 13 includes a shutter 30 for switching the diameter of the laser beam B which is projected from the end of the optical fiber 26 toward the half mirror 21 to various sizes depending on the condition of soldering.

The shutter 30 has a plurality of light transmitting holes 31 each having a different diameter, is movably mounted at a position near the end of the optical fiber 26 in the casing 17, and is moved to switch the light transmitting holes 31 facing the optical fiber 26, thereby switching the diameter of the laser beam B which is output from the optical fiber 26 to various sizes. In this instance, the shutter 30 may be constructed such that the plurality of light transmitting holes 31 are arranged in line, and the shutter 30 is linearly slid to switch the light transmitting holes 31 to various sizes, and it may also be constructed such that the plurality of light transmitting holes 31 are arranged to form a circular arc, and the shutter 30 is rotated on the center of the circular arc as a fulcrum, thereby switching the light transmitting holes 31. In addition, it is preferable that the laser beam B can be shut using a part of the shutter 30 which has no hole.

Figure 3A:
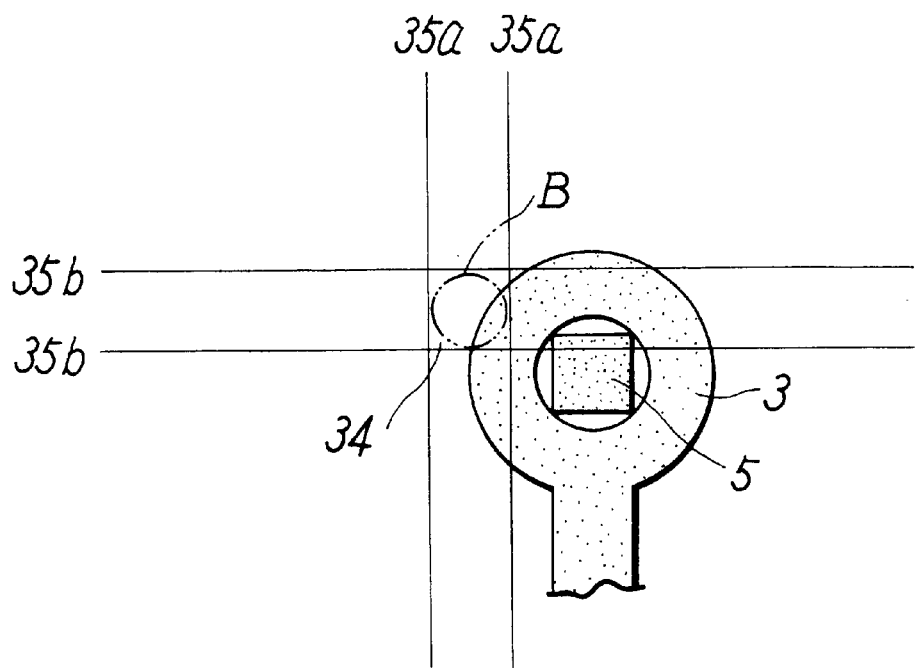
FIGS. 3(A) and 3(B) are front views respectively showing an image displayed on a monitor screen before positioning and an image after positioning.
Figure 3B:
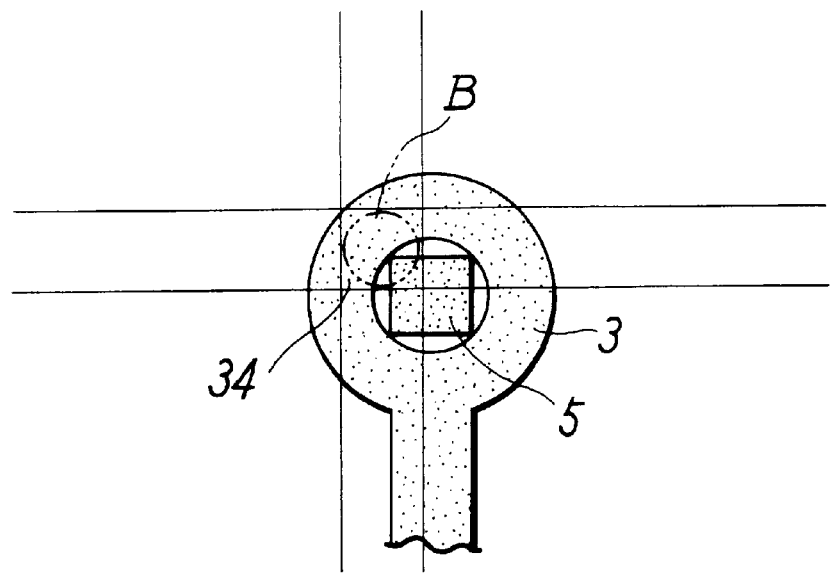

On the other hand, the camera 19 has a monitor 33 for displaying a captured image of the object 14 to be soldered onto a screen connected thereto in an enlarged view. The monitor 33 is, as shown in FIG. 3, constructed so that a projection spot 34 positioned on the optical axis L of the laser beam B can be shown by a part surrounded by two vertical parallel lines 35a and 35a and two horizontal parallel lines 35b and 35b. Thus, while the positional relationship between the object 14 to be soldered and the projection spot 34 is observed on the screen, the movable arm 12 is operated to finely adjust the position of the soldering head 13, thus, the object 14 to be soldered and the projection spot 34 are properly positioned for soldering. Thus, while the image in a state in which the projection spot 34 does not overlap with both the metallic pattern 3 on the printed board 1 and the connector pin 5 of the electronic part 4 at a proper ratio, as shown in FIG. 3(A), which is an image before positioning, is observed, the position of the soldering head 13 is finely adjusted to move the projection spot 34 so that the projection spot 34 overlaps with both the metallic pattern 3 and the connector pin 5 at a proper ratio, as shown in FIG. 3(B), thus performing positioning.

Accordingly, when the soldering is performed by projecting the laser beam B from the soldering head 13 after positioning of the projection spot 34, the laser beam B is projected onto the position of the projection spot 34, thus, the metallic pattern 3 and the connector pin 5 can be reliably soldered with very high accuracy.

In addition, when the projection spot 34 is positioned as described above, the projection spot 34 is indicated only by the parallel lines 35a and 35a and 35b and 35b, and the laser beam B is not actually projected to the portion. The laser beam B may be, however, projected in a state in which the output is decreased as much as necessary. Also, the size of the projection spot 34 may be varied by adjusting the space between the parallel lines. Accordingly, an optimum diameter of the projection spot 34 can be selected depending on conditions, such as the shape and the size, of the metallic pattern 3 and the connector pin 5, thus, the diameter of the laser beam B can be switched to various sizes by the shutter 30 based on the diameter of the projection spot 34.

An observation illumination mechanism 40 is provided for illuminating the object 14 to be soldered during positioning. The observation illumination mechanism 40 transmits the light from a light source 41 to an optical head 43 disposed near the object 14 to be soldered using an optical fiber 42, and illuminates the object 14 to be soldered, such as the printed board 1, from the optical head 43. However, an ordinary lamp may directly illuminate the object 14 to be soldered.

The soldering head 13 is also provided with a solder supply mechanism 45 for supplying thread-like solder 46 to the part to be soldered and a gas supply mechanism 47 for ejecting an inert gas such as nitrogen, and the control device 15 controls the operations.

The solder supply mechanism 45 includes a supply section 49 for supplying thread-like solder which is wound around a reel by a necessary amount, and a solder guide 50 for feeding the thread-like solder 46 from the supply section 49 toward the object 14 to be soldered, wherein the thread-like solder 46 fed by the solder guide 50 is melted with the laser beam B, thereby performing soldering. In this case, it is preferable that the solder guide 50 be provided with a heater to heat the thread-like solder 46 in advance. Also, it is preferable to use lead-free solder having no lead component as the thread-like solder 46.

On the other hand, the gas supply mechanism 47 includes a gas supply source 52 for supplying the inert gas such as nitrogen through a pipe 51, and a heater 53 for heating the inert gas from the gas supply source 52 in advance, wherein the hot inert gas which is heated by the heater 53 in advance is ejected towards the object 14 to be soldered from a gas ejection nozzle 54.

The gas ejection nozzle 54 is provided at the end of the casing 17 of the soldering head 13 and is also used as the projection aperture 18 for projecting the laser beam B. In addition, a port 55 for connecting the pipe 51 is provided at the side of the end of the casing 17, and is connected to the projection aperture 18 through a channel 56. Through the projection aperture 18, that is, the gas ejection nozzle 54, the hot inert gas can be ejected towards the object 14 to be soldered along the optical axis L of the laser beam B. However, the gas ejection nozzle 54 may be provided separately from the projection aperture 18, and in this case, it is preferable that it be formed so as to surround the projection aperture 18.

Thus, since the soldering is performed while the hot inert gas is ejected, the laser beam B is entirely surrounded by the hot inert gas, so that decrease in temperature resulting from contact with cool air can be prevented, and auxiliary heating of the object 14 to be soldered can be performed by the hot inert gas, and consequently, soldering can be efficiently performed using the energy of the laser beam B effectively. Also, since soldering can be performed in a state in which it is sealed from the air by the atmosphere of the inert gas, not only can oxidation or rejection of solder be prevented, but also spattering and flux residue are decreased, thereby increasing soldering accuracy. In the inert gas, a reducing gas such as hydrogen can be mixed.

Figure 4A:
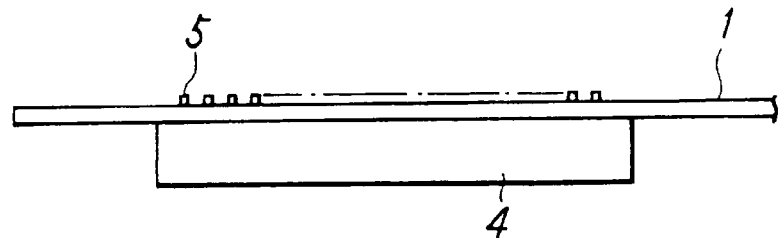
FIG. 4(A) is a side view of an object to be soldered and FIG. 4(B) is a plan view thereof.
Figure 4B:
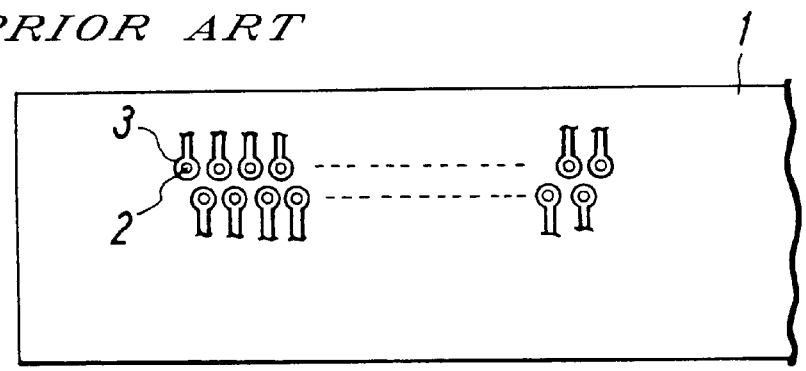
Figure 5:
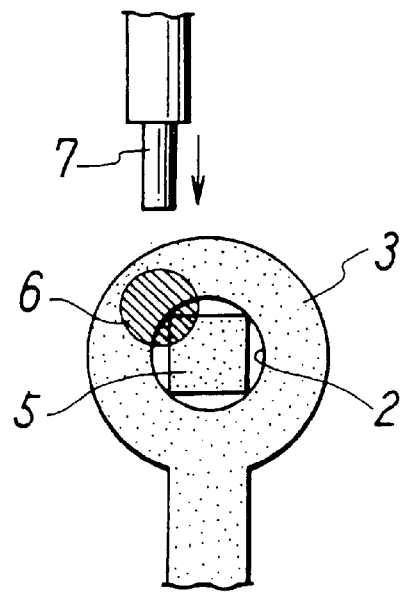
FIG. 5 is a plan view showing a part of the object to be soldered in FIG. 4 on an enlarged scale.

In the soldering apparatus having the above structure, for example, in the case of soldering the printed board 1, as shown in FIGS. 4(A) and 4(B), first, positioning is preformed at a first soldering point so that the laser beam B is projected to both the metallic pattern 3 and the connector pin 5 at a proper ratio. The positioning is performed as follows: The images of the first metallic pattern 3 and the connector pin 5 are taken with the camera 19 mounted on the soldering head 13; the images are displayed on the screen of the monitor 33 as shown in FIG. 1; and while the screen is observed, the movable arm 12 is moved by the control device 15 to finely adjust the position of the soldering head 13 so that the projection spot 34, which is indicated by the parallel lines 35a and 35a and 35b and 35b, is made to overlap both the metallic pattern 3 and the connector pin 5 at a proper ratio.

After completion of the soldering, when a soldering start button of the control device 15 is pressed, the laser beam B is projected from the soldering head 13, and the thread-like solder 46 is automatically supplied to the object 14 to be soldered from the solder guide 50 by a necessary amount, and furthermore, the hot inert gas having a high temperature is ejected from the gas ejection nozzle 54 at the end of the soldering head 13, thus performing soldering in the inert gas atmosphere. In this instance, various conditions necessary for automatic operation, such as the location, the space, and the number of the metallic patterns 3, are set in the control device 15 in advance by teaching, and the positioning is then performed at the first soldering point. Thus, soldering points are automatically soldered one by one while maintaining the positional relationship.

Accordingly, the positioning is performed while the positional relationship between the object 14 to be soldered, which is displayed on the screen of the monitor 33 on an enlarged scale, and the projection spot 34 of the laser beam B is observed.

Thus, the positioning operation can be significantly accurately performed in a short time compared with the conventional method in which positioning is performed while the slight soldering spot is observed with the naked eye from a position diagonally above. Consequently, the accuracy of soldering subsequent to that can be improved, and also, the time required for the entire soldering operation can be remarkably reduced, thereby improving the operating efficiency.

In addition, since the image pickup camera 19 is mounted on the soldering head 13 in such a manner that the optical axis L coincides with that of the laser beam B, the soldering head 13 is used for both projection of the laser beam B and imaging by the camera 19. Thus, the structure is simple and streamlined, and the positioning of the object 14 to be soldered and the projection spot 34 of the laser beam B can be easily and accurately performed. Also, immediately after completion of the positioning, the soldering operation by the laser beam B can be started, therefore, after positioning, there is no need to move the camera 19 to another position where it is not used.

Moreover, since there is no need to actually project the laser beam B when positioning, even if the laser beam B has no visible light area, there is no need to form visible light with a He-Ne laser or the like and to project it imitatively, therefore, the positioning operation can be easily and safely performed.

In addition, in the above-described embodiment, an example is shown, in which the thread-like solder 46 is used. However, it may be arranged that cream-like solder in a melted state is supplied from a nozzle-like solder guide, and while it is applied, soldering is performed. Alternatively, it may be arranged that cream-like solder, which is applied to the soldering point in advance, is melted with the laser beam, thereby performing soldering.

In addition, in the above described embodiment, the object 14 to be soldered is fixedly mounted on the base 10, and the soldering head 13 mounted on the movable arm 12 of the robot is moved, thus, positioning of the laser beam B and soldering are performed. However, it is also possible that the object 14 to be soldered is placed on a Y—Y table and the soldering head 13 can be moved in the Z direction, wherein, when the laser beam B is positioned, the object 14 to be soldered is moved with the Y—Y table, and when the soldering is performed, the Y—Y table and the soldering head 13 are moved together.

Also, in the above-described embodiment, the soldering head 13 or the object 14 to be soldered is manually moved to position the laser beam B. However, the image captured by the camera 19 may be taken into an image-processing unit enclosed in the control device 15, wherein the image is processed so that the metallic pattern 3, the connector pin 5, and the projection spot 34 are properly positioned, and accordingly, the soldering head 13 and the object 14 to be soldered may be automatically moved relative to each other, thereby performing positioning.

According to the present invention, as described above, when the laser beam is projected to the object to be soldered for soldering, the positioning of the projection position of the laser beam can be easily and accurately performed in a short time, and the accuracy of the subsequent soldering can be improved.

What is claimed is:

1. A laser soldering method comprising:

a soldering head for projecting a laser beam for soldering toward an object to be soldered; and an image pickup camera mounted on said soldering head in such a manner that an optical axis thereof coincides with an optical axis of said laser beam, wherein said camera images the object to be soldered and displays the image on a monitor screen, and displays a projection spot positioned on an optical axis of the laser beam on the monitor screen, wherein the projection spot is indicated on the monitor screen by a portion surrounded by two vertical parallel lines and two horizontal parallel lines between which a space between the parallel lines is adjustable, wherein said soldering head and the object to be soldered are moved relative to each other to position said projection spot while the positional relationship between the object to be soldered and the projection spot is observed on the monitor screen, wherein the laser beam is projected from said soldering head to the object to be soldered, thus, performing soldering, and wherein a hot inert gas is heated to a specified temperature in advance, completely surrounds the laser beam and is ejected from a gas ejection nozzle provided in said soldering head along the optical axis of the laser beam.

2. A laser soldering apparatus comprising:

a soldering head for projecting a laser beam for soldering toward an object to be soldered;

a laser mechanism connected to said soldering head;

an image pickup camera mounted on said soldering head in such a manner that an optical axis thereof coincides with an optical axis of the laser beam;

a monitor which displays an image of the object to be soldered, which is taken by the camera, on a screen, and which displays a projection spot positioned on the optical axis of the laser beam on the screen; and a control device for moving said object to be soldered and the soldering head relative to each other, wherein said projection spot displayed on said monitor screen is indicated by a portion surrounded by two vertical parallel lines and two horizontal parallel lines, and wherein a size of said projection spot is freely adjusted by changing a space between the parallel lines, wherein said soldering head includes a gas ejection nozzle for ejecting an inert gas along the optical axis of the laser beam, and wherein the gas ejection nozzle has a gas supply mechanism for supplying a hot inert gas, which is heated in advance and completely surrounds the laser beam, connected thereto.

3. A soldering apparatus according to claim 2, wherein said soldering head is mounted on a movable arm, and wherein the movable arm is controlled by said control device so that said soldering head is moved along the object to be soldered.

4. A soldering apparatus according to claim 2, wherein said soldering head includes a cylindrical casing having a laser-beam projection aperture at an end thereof, optical lenses disposed in the casing, and a half mirror disposed at a position nearer to a base end of the casing than to the optical lenses in such a manner that said half mirror is disposed at an angle of 45 degrees to the optical axis, wherein said camera is mounted on the base end of the casing in such a manner that said camera can image the object to be soldered from said projection aperture via the half mirror and the optical lenses, and wherein an optical fiber for outputting the laser beam from said laser mechanism toward the half mirror is connected to a fiber connecting section formed at the side of the casing at a position corresponding to said half mirror.

5. A soldering apparatus according to claim 4, wherein the fiber connecting section in said soldering head includes a switch for switching the diameter of the laser beam which is output from the optical fiber.

6. A soldering apparatus according to claim 2, further comprising a solder supply mechanism for supplying solder to a portion to be soldered.

* * * * *